United States Patent
Kinoshita et al.

(10) Patent No.: US 7,323,097 B2
(45) Date of Patent: Jan. 29, 2008

(54) ELECTROPLATING METHOD FOR A SEMICONDUCTOR DEVICE

(75) Inventors: Mitsuru Kinoshita, Hakodate (JP); Tsugihiko Hirano, Hakodate (JP); Katsunori Takahashi, Hakodate (JP)

(73) Assignee: Renesas Technology Corp., Tokyo (JP)

( * ) Notice: Subject to any disclaimer, the term of this patent is extended or adjusted under 35 U.S.C. 154(b) by 65 days.

(21) Appl. No.: 11/002,437

(22) Filed: Dec. 3, 2004

(65) Prior Publication Data

US 2005/0121331 A1   Jun. 9, 2005

(30) Foreign Application Priority Data

Dec. 5, 2003   (JP)   .............................. 2003-406793

(51) Int. Cl.
  *C25D 3/60* (2006.01)
  *C25D 5/50* (2006.01)
  *C25D 5/02* (2006.01)
  *C25D 7/06* (2006.01)
  *C25D 7/00* (2006.01)

(52) U.S. Cl. .................... 205/252; 205/123; 205/140; 205/145

(58) Field of Classification Search ................ 205/123, 205/140, 145, 252
  See application file for complete search history.

(56) References Cited

U.S. PATENT DOCUMENTS

| | | | | |
|---|---|---|---|---|
| 4,439,284 A | * | 3/1984 | Walter | 205/96 |
| 5,039,576 A | * | 8/1991 | Wilson | 428/626 |
| 5,674,374 A | * | 10/1997 | Sakurai et al. | 205/252 |
| 5,744,013 A | | 4/1998 | Botts et al. | 204/242 |
| 6,342,146 B1 | * | 1/2002 | Velasquez | 205/145 |

FOREIGN PATENT DOCUMENTS

| | | | |
|---|---|---|---|
| JP | 02088790 A | * | 3/1990 |
| JP | 7-065206 | | 3/1995 |
| JP | 2000045099 A | * | 2/2000 |

* cited by examiner

*Primary Examiner*—Edna Wong
(74) *Attorney, Agent, or Firm*—Antonelli, Terry, Stout & Kraus, LLP.

(57) ABSTRACT

An electroplating method calls for immersing a body to be plated in a plating solution containing tin and bismuth to form a tin-bismuth alloy skin layer on surfaces of the body. The plating is carried out such that a solid tin metal and a solid bismuth metal placed in the plating solution are connected to an anode and the body to be plated is connected to a cathode of a power supply.

13 Claims, 15 Drawing Sheets

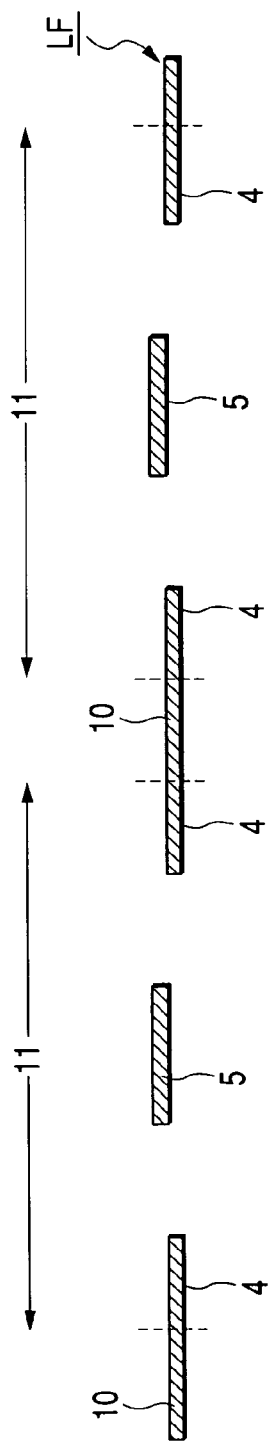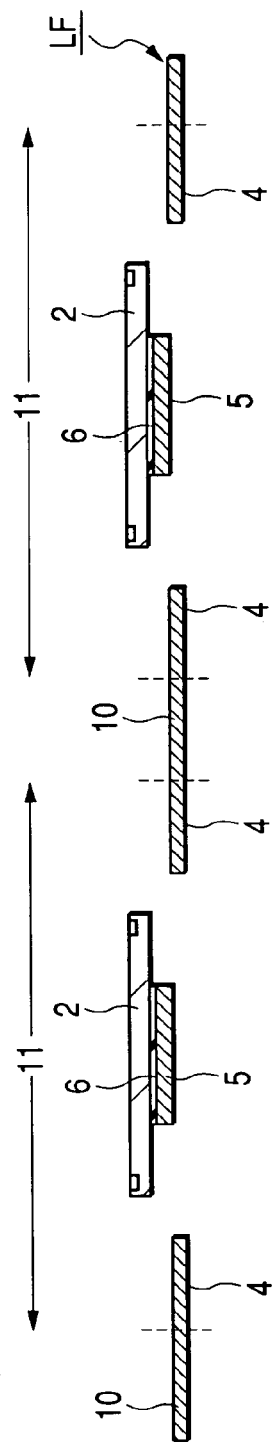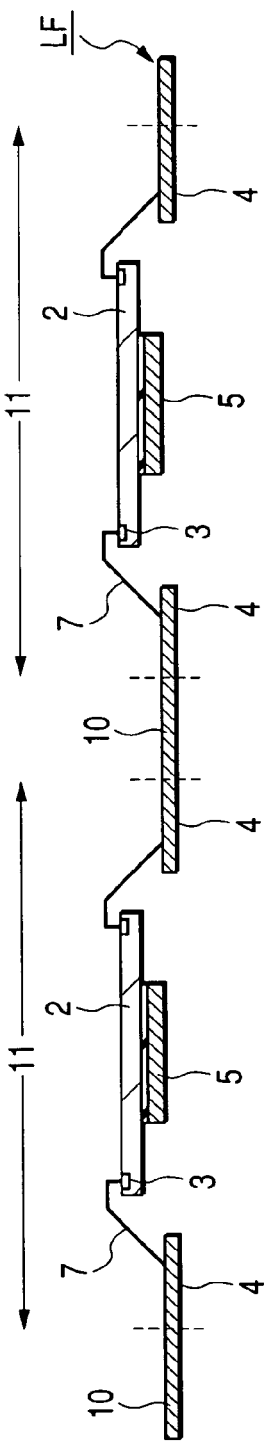

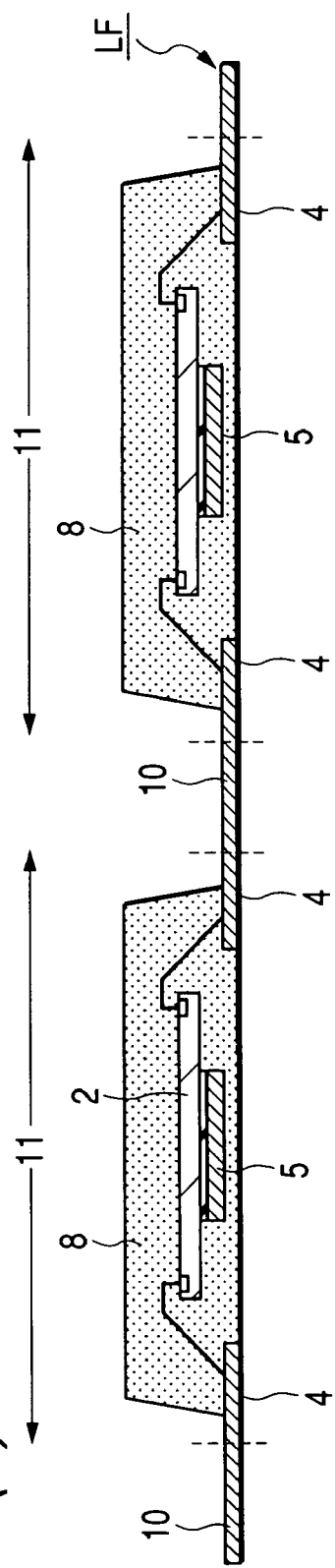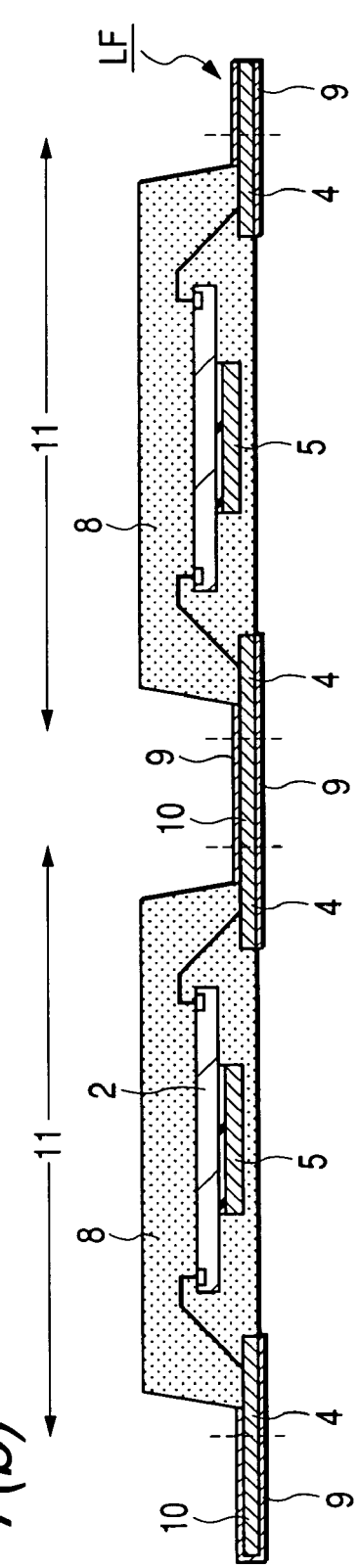

ELECTROPLATING METHOD FOR A SEMICONDUCTOR DEVICE

CROSS-REFERENCE TO RELATED APPLICATION

The present application claims priority from Japanese Patent Application No. 2003-406793, filed on Dec. 5, 2003, the content of which is hereby incorporated by reference into this application.

BACKGROUND OF THE INVENTION

This invention relates in general to an electroplating (electrolytic plating) technique, and, more particularly, to a technique that is effective for application to a plating step in the process of manufacture of a semiconductor device.

In semiconductor devices manufactured by use of lead frames, it is usual to form an alloy skin layer at external connection terminals of a lead so as to secure solder wettability in the course of mounting the semiconductor device on a substrate through soldering. Although an alloy skin layer made of a Pb (lead)—Sn (tin) composition has been predominantly used for such a skin layer, a limitation has been recently placed on the use of Pb from the standpoint of environmental protection. Thus, the use of a Pb-free alloy skin layer has been in development.

Various types of Pb-free compositions have been proposed for use as an alloy skin layer and, in fact, some have been reduced in practice. For example, there a known alloy skin layer made of a Sn—Bi composition (i.e. a Sn—Bi alloy skin layer). This Sn—Bi alloy skin layer is disclosed, for example, in Japanese Patent Publication Hei 7(1995) 65206. In this publication a technique for forming a Sn—Bi alloy skin layer according to an electroplating method is also disclosed.

SUMMARY OF THE INVENTION

We have studied the plating procedures used in the manufacture of a semiconductor device, and, as a result, the following problems have been found.

In the plating step, a Sn—Bi skin layer is formed by an electroplating method. In the typical electroplating method, a metal is electrolytically deposited on a body to be plated (i.e. surfaces of an electric conductor) from a plating solution (i.e. a metal salt solution) through electrolytic reaction, thereby forming an alloy skin layer. The formation of a Sn—Bi alloy layer is carried out by immersing a lead frame in a plating solution containing tin and bismuth, and then connecting a solid tin metal disposed in the plating solution to an anode and the lead frame to a cathode of a power source.

Where a Sn—Bi alloy skin layer is formed in this way, the repetition of the plating cycle results in a reduction in the concentration of the tin and bismuth in the plating solution, so that it becomes necessary to supply additional tin and bismuth to the plating solution. The supply of tin to the plating solution is carried out by permitting a solid tin metal to be electrolytically dissolved out in the plating solution. On the other hand, the supply of bismuth to the plating solution is performed by replenishing a bismuth solution by addition to the plating solution. Although the replenishment of the bismuth solution may differ depending on the number of leads and the size of the lead frame of a semiconductor device, it is necessary to perform the replenishment once in every 20,000 semiconductor devices, say, on the basis of the number of semiconductor devices being processed. In addition, the replenishment of a bismuth solution has to be carried out after the operation of the electroplating apparatus is stopped, for which it takes 15 to 20 minutes, which is the time necessary for one replenishment. More particularly, for replenishing the solution in an amount corresponding to a reduction of the bismuth in the plating solution, it is essential to stop the electroplating apparatus once in every unit hour, thus lowering the operating rate (i.e. the number of plating cycles) of the electroplating apparatus. This lowering of the operating rate (the number of plating cycles) of the electroplating apparatus becomes a factor which leads toward an increase in the cost of the semiconductor device.

With the supply of bismuth in the plating solution by addition of a bismuth solution thereto, the concentration of bismuth in the plating solution becomes irregular in the period from after replenishment of the bismuth solution to completion of replenishment of a fresh bismuth solution. This is apt to cause a variation in the compositional ratio of the resultant Sn—Bi alloy layer. The variation of the compositional ratio causes the mounting reliability of the semiconductor device to be lowered.

It is an object of the present invention to provide an electroplating technique which ensures an enhanced operating rate (i.e. an increase in plating cycles) of an electroplating apparatus.

It is another object of the invention to provide a technique which enables a semiconductor device to be manufactured at a low cost.

It is a further object of the invention to provide a technique which enables the mounting reliability of a semiconductor device to be improved.

The above and other objects and novel features of the invention will become apparent from the following description when taken with reference to the accompanying drawings.

Typical embodiments of the invention will be briefly described below.

(1) In an electroplating method wherein a body to be plated is immersed in a plating solution containing tin and bismuth to form a tin-bismuth alloy skin layer on surfaces of the body, plating is carried out such that a solid tin metal and a solid bismuth metal that have been placed in the plating solution are connected to an anode and the body to be plated is connected to a cathode of a power supply.

(2) In an electroplating method wherein a body to be plated is placed in a plating solution containing tin and bismuth to form a tin-bismuth alloy skin layer on a surface of the body, plating is carried out such that a plurality of metallic cases, each of which accommodates therein a solid tin metal and a solid bismuth metal, and which are provided in the plating solution in such a way as to interpose the body between the cases, while maintaining a given space therefrom, are connected to an anode and the body is connected to a cathode of a power supply.

(3) Plating is carried out according to a procedure comprising the steps of:

(a) providing a resin-molded or encapsulated semiconductor chip, and a lead frame having leads electrically connected to electrodes of the semiconductor chip; and (b) immersing the lead frame in a plating solution containing tin and bismuth to form a tin-bismuth alloy skin layer on the leads, wherein in the step (b), solid tin metal and solid bismuth metal are placed in the plating solution and are connected to an anode and the lead frame is connected to a cathode of a power supply.

It will be noted that we have made a prior-art search for electroplating for forming a Sn—Bi alloy skin layer based on the results of our investigation. As a result, we found the afore-indicated Japanese Patent Publication No. Hei 7(1995)-65206. This publication discloses a technique wherein a bismuth metal is used as an anode, and the replenishment of bismuth ions in an amount corresponding to deposition of bismuth from a plating bath is realized through electrolytic dissolution of the bismuth metal anode, and the replenishment of stannous ions in an amount corresponding to deposition of tin from the plating solution is realized through dissolution of a stannous salt or stannous oxide added to the plating solution. In the plating technique of this patent publication, tin is supplied to the plating solution in a liquid form, and, thus, the operating rate (i.e. plating cycles) of an electroplating apparatus is lowered.

The effects attained by typical embodiments of the invention will be briefly described below.

According to the invention, the operating rate of an electroplating apparatus can be enhanced (i.e. plating cycles can be increased in number).

Further, lower manufacturing costs in the production of semiconductor devices can be realized along with an improved mounting reliability thereof.

BRIEF DESCRIPTION OF THE DRAWINGS

FIGS. 6(a) to 6(c), respectively, show steps in the manufacture of a semiconductor device, wherein FIG. 6(a) is a sectional view showing a product-forming region of a lead frame, FIG. 6(b) is a sectional view showing a chip bonding step, and FIG. 6(c) is a sectional view showing a wire bonding step;

FIGS. 7(a) and 7(b), respectively, show steps in the manufacture of the semiconductor device subsequent to the steps of FIGS. 6(a) to 6(c), wherein FIG. 7(a) is a sectional view showing a molding step, and FIG. 7(b) is a sectional view showing a plating step;

DETAILED DESCRIPTION OF THE PREFERRED EMBODIMENTS

Figure 1:
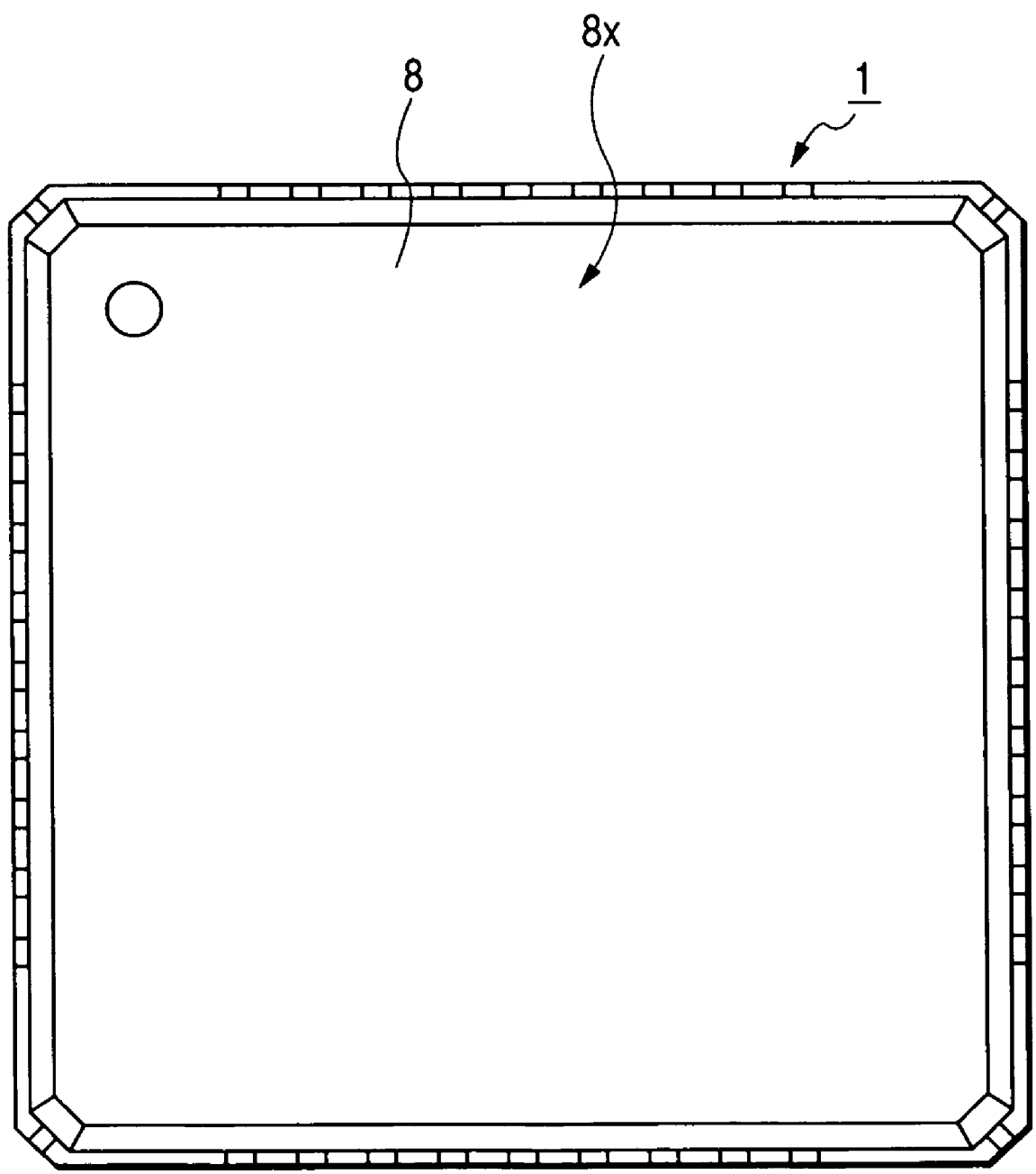
FIG. 1 is a diagrammatic plan view showing the outer structure of a semiconductor device.

The embodiments of the invention will be described in detail with reference to the accompanying drawings, in which like reference numerals indicate like parts or members having a similar function throughout the drawings and are not repeatedly described.

A first embodiment of the present invention will be described with reference to FIGS. 1-15.

Figure 2A:
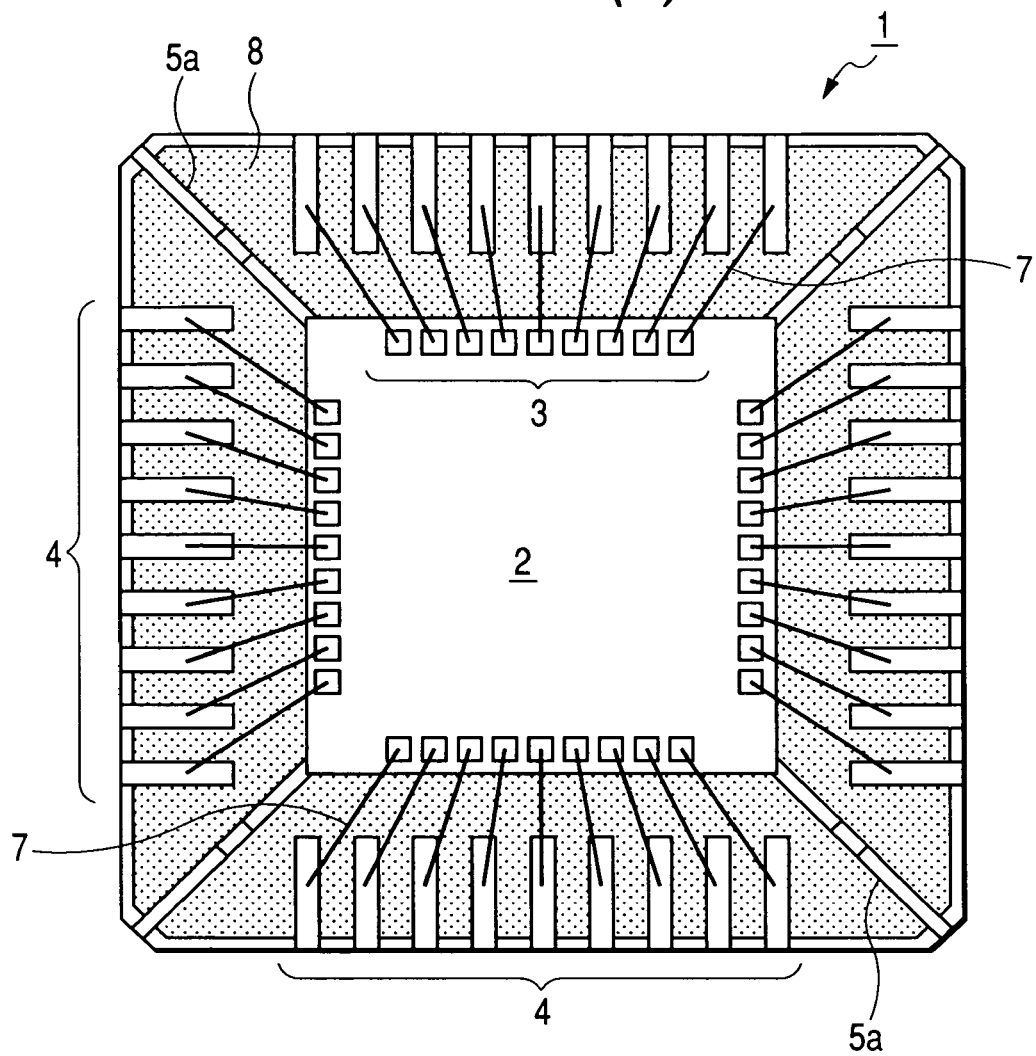
FIGS. 2(a) and 2(b) are, respectively, a plan view and a section view showing the inner structure of the semiconductor device.
Figure 2B:
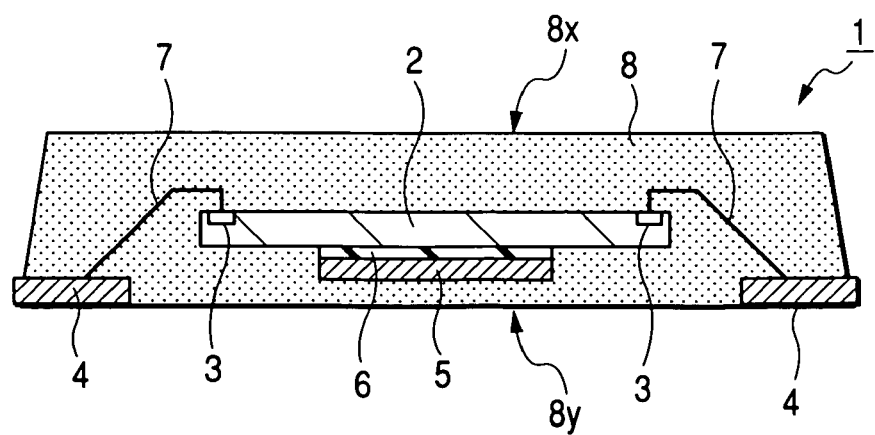

As shown in FIGS. 2(a) and 2(b), a semiconductor device 1 according to a first embodiment of the present invention has a structure including a semiconductor chip 2, a plurality of leads 4, a chip support (i.e. a die pad, a tab, and a chip mounting portion) 5, four suspending leads 5a, a plurality of bonding wires 7, a plastic molding body 8 and the like. The semiconductor chip 2, the plural leads 4, the chip support 5, the four suspending leads 5a, the plural bonding wires 7 and the like are encapsulated by the plastic molding body 8. The semiconductor chip 2 is fixed on the main surface (upper surface) of the chip support 5 by bonding with a bonding agent 6, and the chip support 5 has the four suspending leads 5a integrally combined therewith.

The semiconductor chip 2 has a planar shape which is square, as viewed from the top thereof. In this embodiment, the shape is, for example, that of a regular tetragon. Although not intended as a limitation, the semiconductor chip 2 such an arrangement including, for example, a semiconductor substrate, a plurality of transistor elements formed on the main surface of the semiconductor substrate, multiple wiring layers formed on the main surface of the semiconductor device, wherein insulating layers and wiring layers are, respectively, built up in plural numbers, a surface protective layer (i.e. a final protective layer) formed to cover the multi-layered layer therewith and the like.

The semiconductor chip 2 has a main surface (i.e. a circuit-forming surface) and a back surface which are in opposition to each other, and an integrated circuit is formed on the main surface side of the semiconductor chip 2. The integrated circuit is constituted of transistor elements and wirings formed in the multiple layers, both formed on the main surface of the semiconductor substrate.

The semiconductor chip 2 has, on the main surface thereof, a plurality of bonding pads (electrodes) 3. The plural bonding pads 3 are disposed along individual sides of the semiconductor chip 2. The plural bonding pads 3 are formed at the uppermost wiring layer of the multiple wiring layers of the semiconductor chip 2, and they are exposed through bonding openings, which are formed in the surface protective film of the semiconductor chip 2 at locations corresponding to individual bonding pads 3.

As is particularly shown in FIGS. 1, 2(a) and 2(b), the plastic molding body 8 has a planar shape, which is square as viewed from the top thereof, and it is shaped, for example, as a regular square in this embodiment. The plastic molding body 8 has a main surface (upper surface) 8x and a back surface (lower surface or mounting surface) 8y which are positioned opposite to each other. The plane size (outside size) of the plastic molding body 8 is larger than the plane size (outside size) of the semiconductor chip 2.

For the purpose of ensuring low stress of the plastic molding body 8, this body is formed, for example, of a biphenyl-based thermoplastic resin to which a phenolic curing agent, a silicone rubber, a filler and the like are added. For the formation of the plastic molding body 8, a transfer molding technique which is adapted for mass production is used. The transfer molding technique makes use of a mold die equipped with a pot, a runner, a resin injection gate, a cavity and the like, and a thermoplastic resin is charged from the pot through the runner and resin injection gate into the cavity to form a resin molded body.

In the manufacture of a resin molded or encapsulated semiconductor device, a transfer molding technique of a one-on-one basis type has been adopted, wherein a lead frame having a plurality of product forming regions is provided and each semiconductor chip mounted in the respective product forming regions is molded with a resin in every product-formed region. There is also a transfer molding technique of a bulk molding type, wherein a lead frame having a plurality of product forming regions is provided, and semiconductor chips mounted in the product forming regions are molded with a resin as a whole. In the manufacture of the semiconductor device 1 of this embodiment, the transfer molding technique of the one-on-one basis type is adopted, for example.

As shown in FIGS. 2(a) and 2(b), the plural leads 4 are arranged along the four sides of the resin molding body 8 and extend toward the semiconductor chip 2 from the sides of the resin molding body 8.

The plurality of bonding pads 3 of the semiconductor chip 2 are electrically connected to the plural leads 4. In this Embodiment 1, a bonding pad 3 of the semiconductor chip 2 and a lead 4 are electrically connected via a bonding wire 7. The bonding wire 7 is connected at one end thereof to a bonding pad 3 of the semiconductor chip 2, and the other end opposite to the one end of the bonding wire 7 is connected to a lead 4 at the outside (outer periphery) of the semiconductor chip 2. For the bonding wire 7, a gold (Au) wire is used, for example. The connection of the wire 7 is carried out, for example, by a nail head bonding (ball bonding) method using thermocompression and ultrasonic vibrations.

The plural leads, respectively, have main and back surfaces which are mutually located opposite to each other, and the back surface of each of the plural leads 4 is exposed from a back side of the resin molding body 7. In the QFN type semiconductor device 1 used in this embodiment, the back surface of the lead 4 is used as a terminal for external connection.

Figure 3:
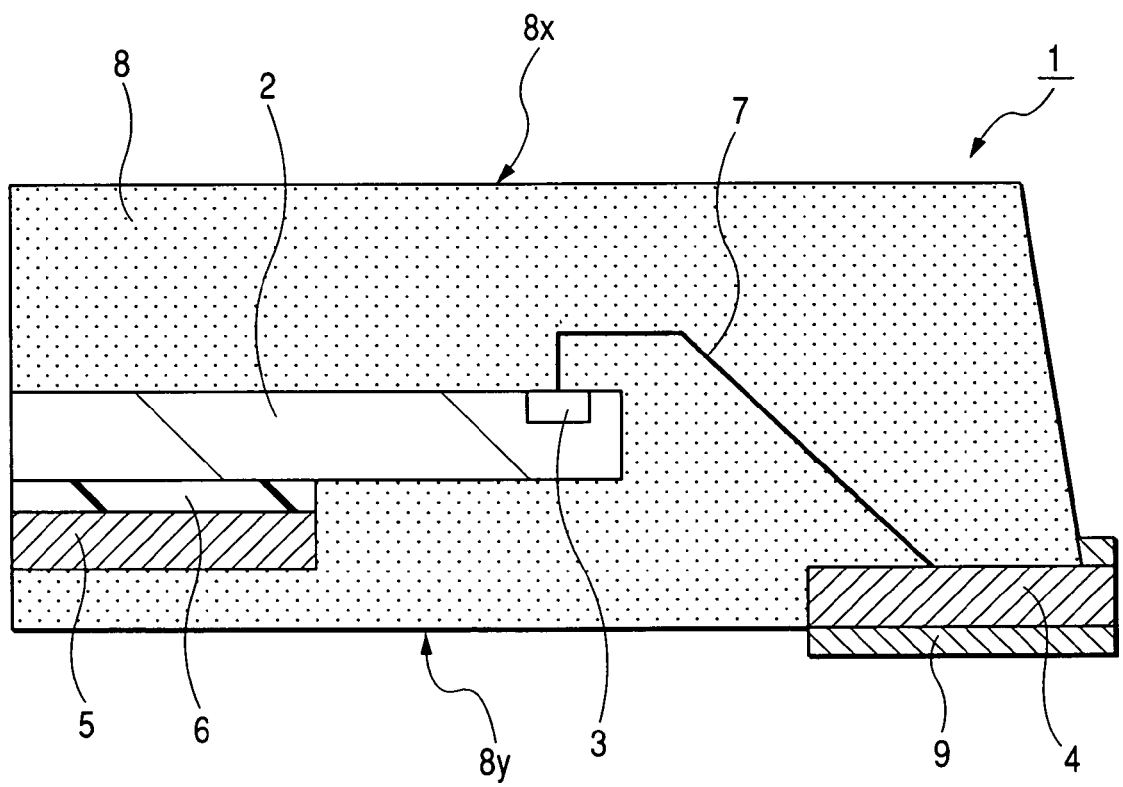
FIG. 3 is an enlarged sectional view showing a part of FIG. 2(b)

On the back surface of the lead 4, an alloy skin (solder skin) layer 9 is formed, as shown in FIG. 3. This solder skin layer 9 is formed for the purpose of securing solder wettability when the semiconductor device is mounted on a printed circuit board through a solder connection. In this embodiment, an alloy layer made of a composition of 98 wt % Sn-2 wt % Bi is used, for example, as the solder skin layer. This Sn—Bi alloy skin layer is formed by an electroplating method as will be described in detail hereinafter. The electroplating method is one wherein a metal is electrolytically deposited from a plating solution on a body or article to be plated (e.g. a surface of an electric conductor) by electrolysis to form the alloy skin layer.

Next, the lead frame used in the manufacture of the semiconductor device 1 will be described with reference to FIGS. 4 and 5.

Figure 4:
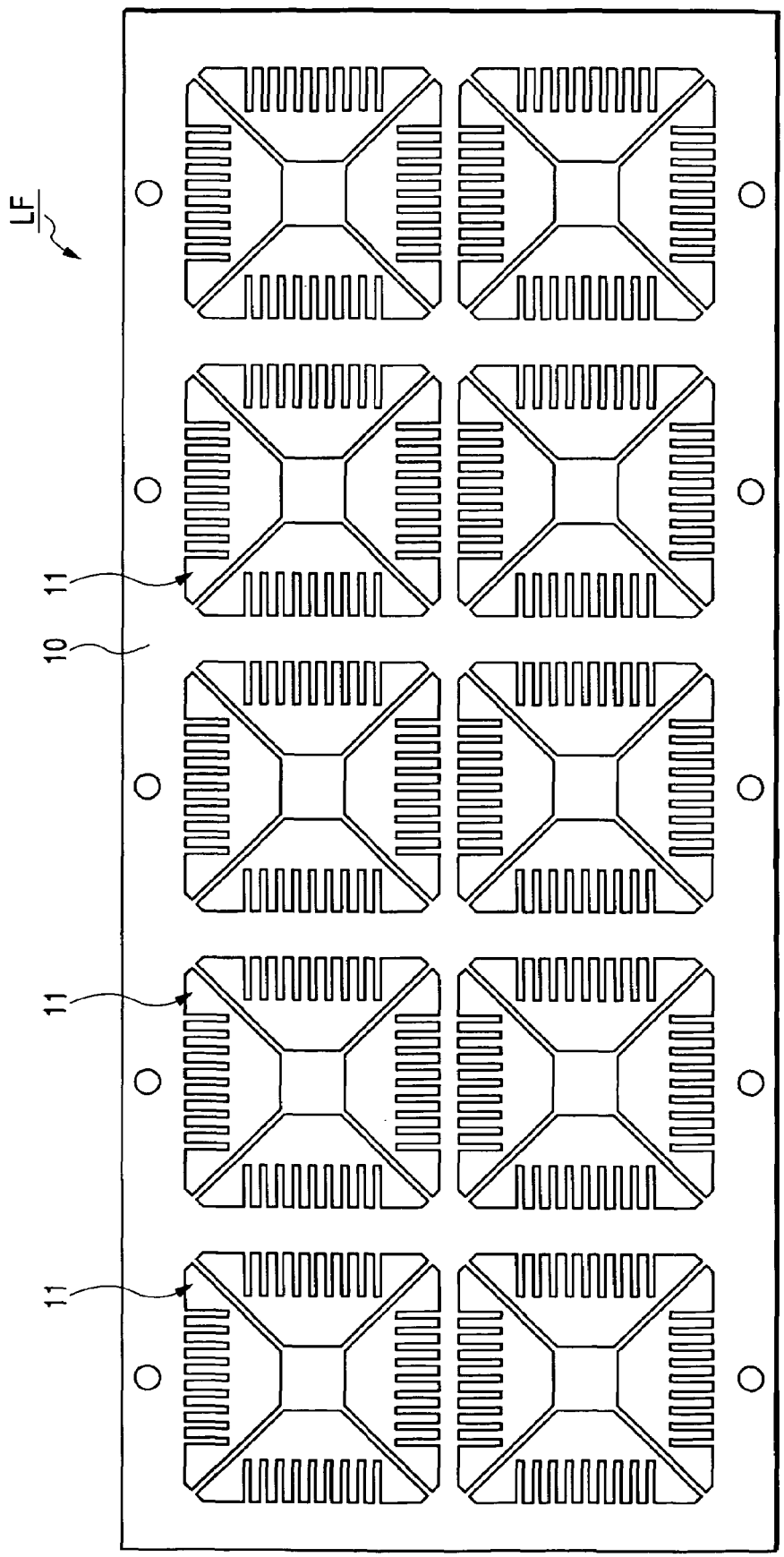
FIG. 4 is a plan view showing a lead frame used for the manufacture of a semiconductor device.
Figure 5:
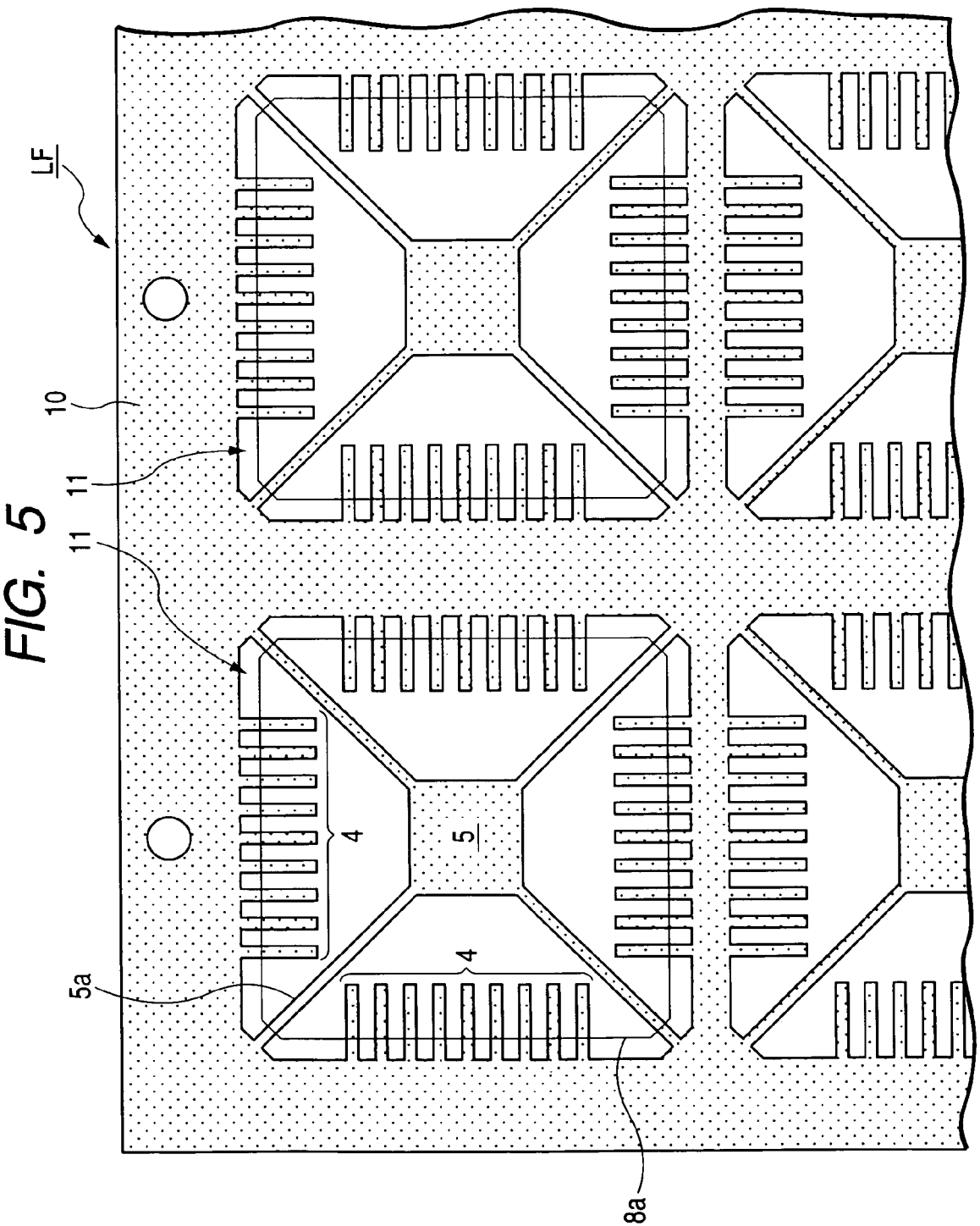
FIG. 5 is an enlarged plan view of a part of FIG. 4.

As shown in FIGS. 4 and 5, the lead frame LF has, for example, a multiple structure wherein a plurality of product-forming regions (device-forming regions) 11 are, respectively, laid out on a frame body (support) 10, including an outer frame and an inner frame so as to be arranged in a matrix form. The respective product forming regions 11 have a plurality of leads 4, one chip support 5 and four suspending leads 5a and the like arranged therein. The chip support 5 is located at the center of the product-forming region 11 and is formed integrally with the frame body 10 via the four suspending leads 5a. The plural leads 4 are arranged by division into four lead groups, and the leads 4 in the individual lead groups are formed integrally with the frame body 10.

The lead frame LF is formed by subjecting a flat sheet (metallic sheet) made, for example, of an iron(Fe)—nickel (Ni) alloy, Cu, or a Cu alloy, to etching or pressing so as to form a predetermined lead pattern. The lead frame LF of this embodiment has the heights of the lead 4 and the chip support 5 offset along the thickness direction thereof, as is particularly shown in FIG. 6(a). This offset is realized by bending the suspending leads 5a.

Next, the manufacture of the semiconductor device 1 will be described with reference to FIGS. 6(a) to 6(c), 7(a) and 7(b).

Initially, the lead frame LF shown in FIGS. 4, 5 and 6(a) is provided, followed by fixedly bonding the semiconductor chip 2 to the chip support 5 of the respective product-forming regions 11 through a bonding agent 6, as shown in FIG. 6(b). The bond fixing of the semiconductor chip 2 is carried out such that the back side of the semiconductor chip 2 and the chip support are arranged face-to-face.

As shown in FIG. 6(c), a plurality of bonding pads of the semiconductor chip 2 and a plurality of leads 4 are electrically connected through the bonding wires 7 in the respective product-forming region 11, respectively.

Next, the resin molding body 8 is formed in the respective product-forming region 11, as shown in FIG. 7(a), by resin molding the semiconductor chip 2, plural leads 4, chip support 5, four suspending leads 5a, plural bonding wires 7 and the like. In this embodiment, the resin molding body 8 is formed according to the transfer molding method of a one-on-one basis type wherein a semiconductor chip mounted in the respective product-forming region 11 is resin molded in every product-forming region.

Next, as shown in FIG. 7(b), an alloy skin layer made of a composition, for example, of 98 wt % Sn-2 wt % Bi, is formed on the back side (i.e. terminals for external connection) of the lead 4 as the alloy skin layer 9. This Sn—Bi alloy skin layer is formed by an electroplating method, as will be described hereinafter.

Next, the lead 4 and the suspending lead 5a are separated by cutting from the frame body 10. In this way, the semiconductor device 1 shown in FIGS. 1, 2(a) and 2(b) is completed.

Next, the plating procedure used in the manufacture of the semiconductor device 1 will be described in detail with reference to FIGS. 8 to 15.

Figure 9:
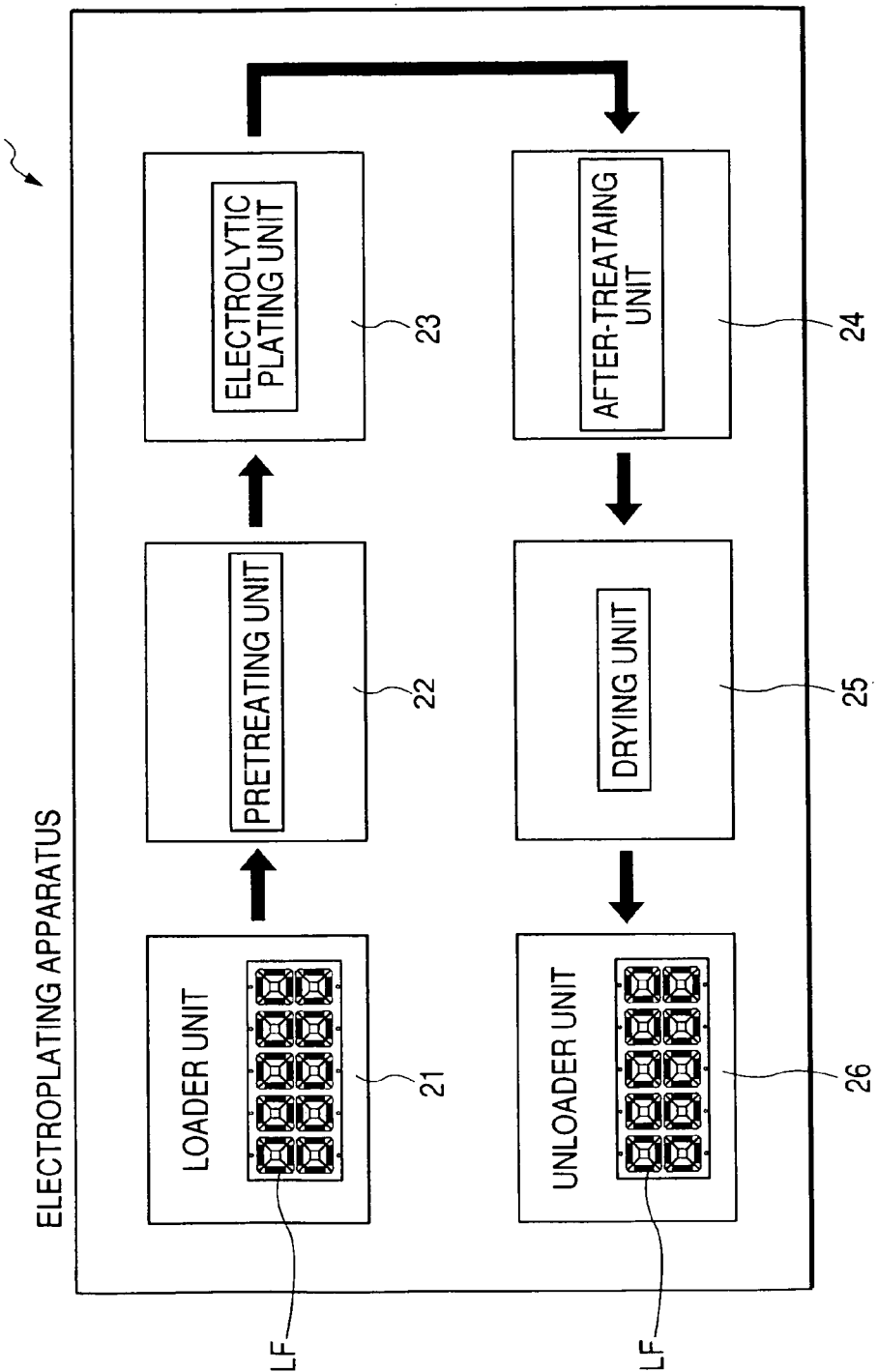
FIG. 9 is a block diagram showing a rough arrangement of an electroplating apparatus used for the manufacture of a semiconductor device.

In the plating procedure, the electroplating apparatus 20 shown in FIG. 9 is used. Although not limitative, the plating apparatus 20 includes a loader unit 21, a pretreating unit 22, a plating unit 23, an after-treating unit 24, a drying unit 25, an unloader unit 26 and the like. The loader unit 21 supplies a lead frame LF to the pre-treating unit 22. In the pretreating unit 22, an alkaline treating solution is, for example, used for defatting in order to remove oily stains and the like from the lead frame LF. Moreover, a treating solution, such as of hydrofluoric acid (HF), hydrogen peroxide ($H_2O_2$) or the like, is used for surface activation of the lead frame LF by etching the frame surface to ensure good adhesion of an alloy skin layer (conductive film). In the plating unit 23, an alloy skin layer is formed on the surface of the lead frame. In the after-treating unit 24, an alkaline treating solution is used to neutralize the alloy skin layer formed in the preceding plating unit 23 and to rinse the treating solution used in the preceding step. In the drying unit 25, moisture attached to the lead frame LF is evaporated. In the unloader unit 26, the lead frame LF which has been processed in the preceding drying unit 25 is accommodated.

Figure 10:
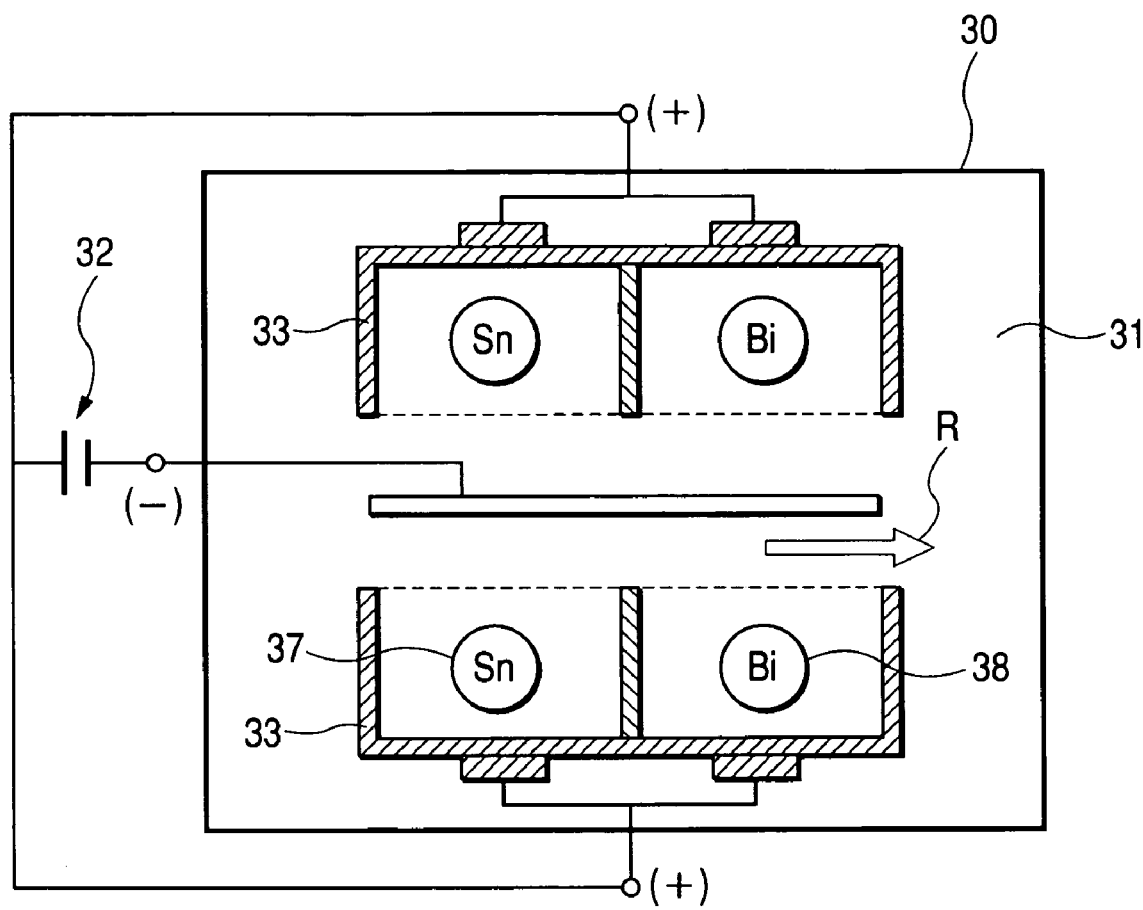
FIG. 10 is a plan view showing a rough arrangement of a plating unit of the plating apparatus.
Figure 11:
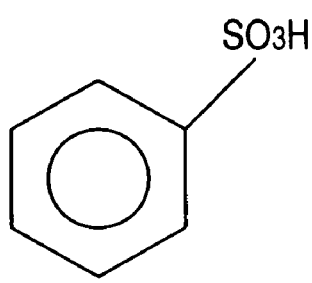
FIG. 11 shows a chemical formula of a plating solution used in the electroplating apparatus of FIG. 9.

In the plating unit 23, a plating vessel 30 is arranged as shown in FIG. 10. In the plating vessel 30, a plating solution 31 is placed. For the plating solution 31, a solution containing, aside from tin and bismuth, an organosulfonic acid having the formula shown in FIG. 11 is used, for example. Tin and bismuth are present in the plating solution 31 at a ratio, for example, of approximately 98 (tin): 2 (bismuth).

Figure 12:
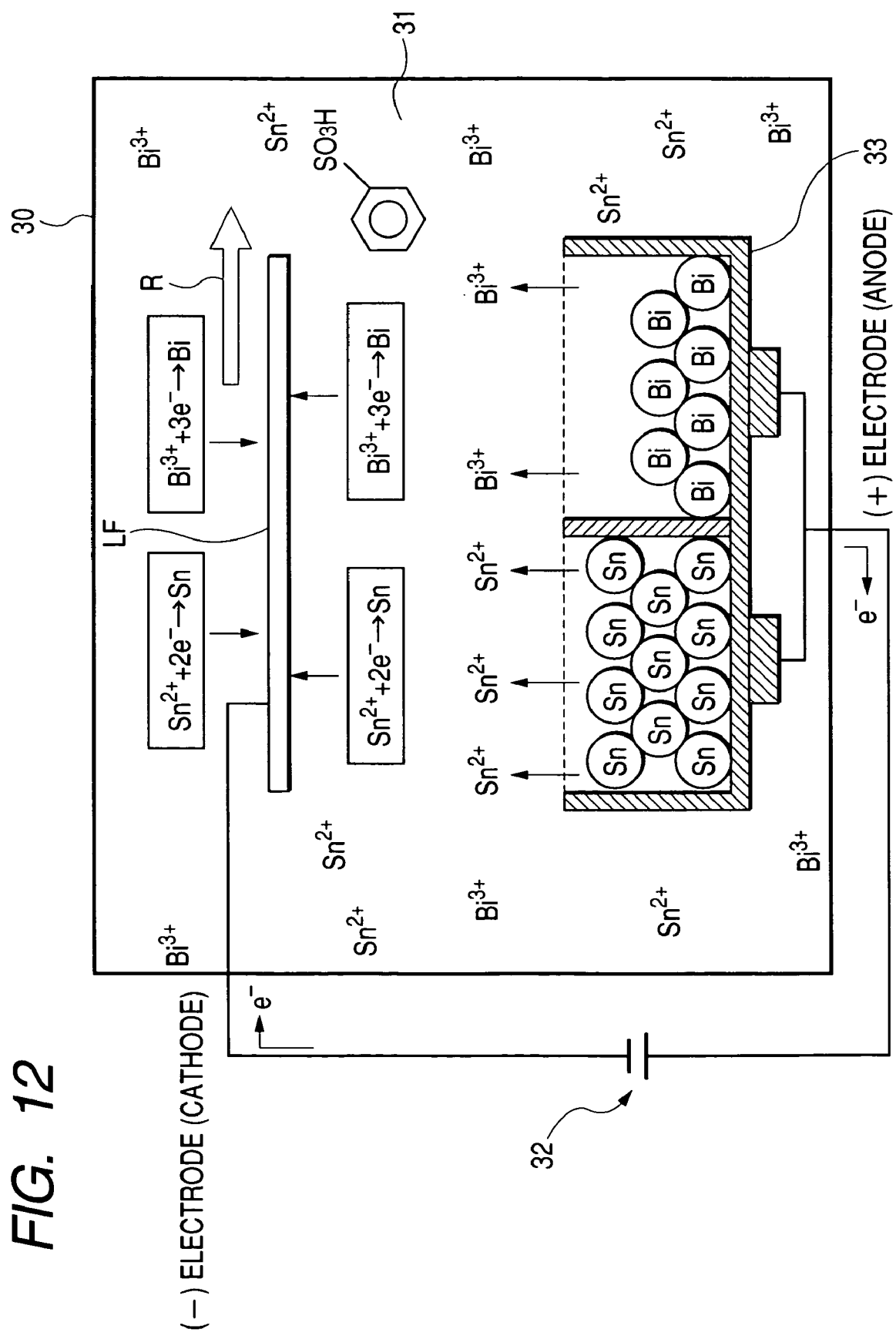
FIG. 12 is a partly enlarged, diagrammatic plan view of FIG. 10.

As shown in FIGS. 10 to 12, a solid tin metal 37 and a solid bismuth metal 38 are placed in the plating solution 31. The solid tin metal 37 and the solid bismuth metal 38 are, respectively, connected to the anode of a power supply 32, while the lead frame LF that represents a body to be plated is connected to the cathode of the power supply 32. The lead frame LF is immersed in the plating solution 31 and is transferred along a path in a transfer direction R in the plating solution 31. During the course of the transfer of the lead frame LF, Sn and Bi in the plating solution 31 are electrolytically deposited on the surface of the lead frame LF, including the terminals for external connection, through electrolytic reaction, thereby forming the alloy skin layer 9 made of a composition of approximately 98 wt % Sn-2 wt % Bi.

The concentrations of tin and Bi in the plating solution are, respectively, decreased as the plating cycles proceed, so that it is necessary to supply tin and bismuth in the plating solution 31. The supply of tin in the plating solution 31 is realized by permitting the solid tin metal 37 to be electrolytically dissolved out in the plating solution. Likewise, bismuth is supplied to the plating solution by permitting the solid bismuth metal 38 to be electrolytically dissolved out in the plating solution.

As stated hereinabove, the solid tin metal 37 and the solid bismuth metal 38 placed in the plating solution 31 are, respectively, connected to the anode, and the lead frame LF is connected to the cathode of the power supply 32 to form the alloy skin layer 9. Thus, the supply of tin to the plating solution is realized by electrolytically dissolving out the solid tin metal 37 in the plating solution 31, and the supply of bismuth to the plating solution is performed by electrolytic dissolution of the solid bismuth metal in the plating solution. In this way, when the plating is carried out, the decrements in amount of tin and bismuth can be supplemented without stopping the plating apparatus 30. Compared to the case where tin and bismuth are, respectively, supplied to the plating solution in the form of a solution, the operating rate of the electroplating apparatus in accordance with the present invention can be improved (i.e. the plating cycles can be increased) because the supplementing time of the solutions is not required. In addition, since the operating rate of the electroplating apparatus is improved (i.e. the plating cycles are increased), the manufacturing costs of the semiconductor device can be reduced.

Further, tin and bismuth are electrolytically dissolved out in the plating solution 31 invariably at a given rate, respectively, in accordance with the present invention, so that the unevenness of concentration, wherein the concentrations of tin and bismuth in the plating solution tend to change with time, can be suppressed. This eventually enables a variation in compositional ratio of a resultant Sn—Bi alloy skin layer to be suppressed, whereby the mounting reliability of the semiconductor device is improved.

Figure 14:
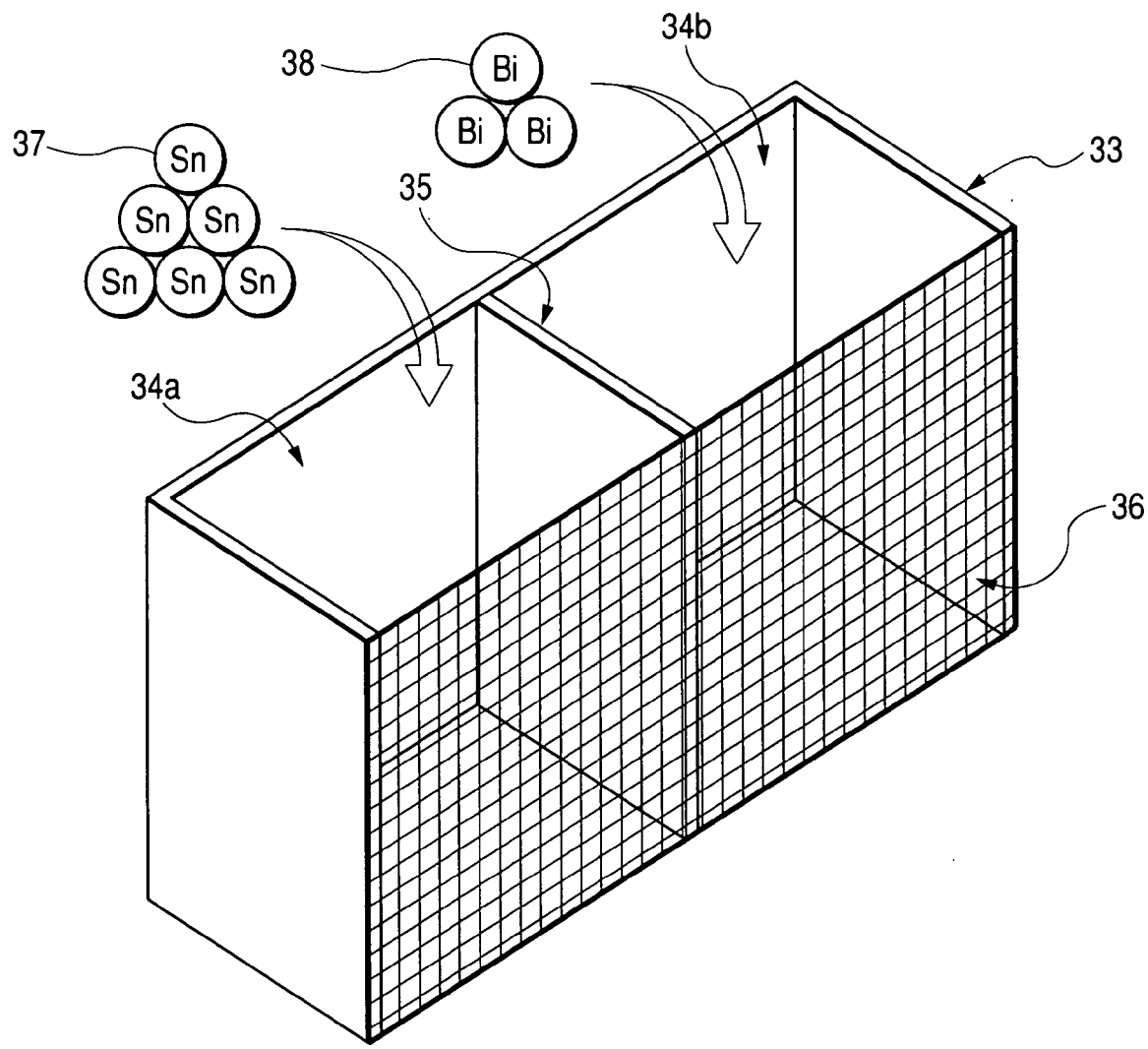
FIG. 14 is a perspective view showing metallic cases used in the plating apparatus of FIG. 9.
Figure 15:
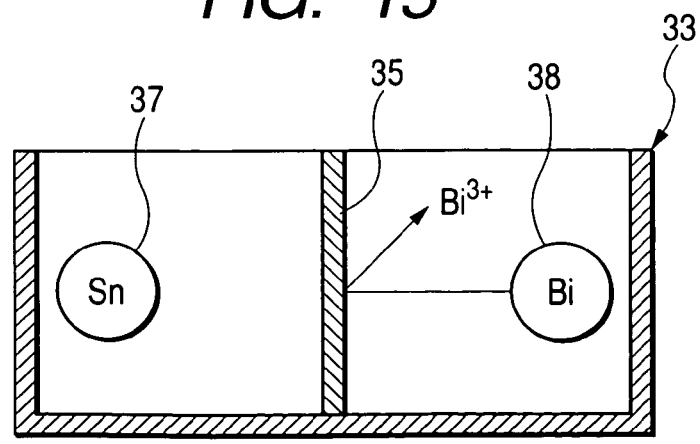
FIG. 15 is a sectional view showing metallic cases of FIG. 14.

The solid tin metal 37 and the solid bismuth metal 38 are placed in the plating solution while being accommodated in a metallic case 33. The metallic case 33 is connected to the anode of the power supply 32. As shown in FIG. 14, the metallic case 33 is open at the upper side thereof for permitting easy charging of the solid tin metal 37 and the solid bismuth metal 38 into the plating solution 31. The front side of the case 33 is constituted of a meshwork 36 so as to allow the plating solution to enter into the case. More particularly, the metallic case 33 has a structure such that, in the course of operating the electroplating apparatus, a fresh solid tin metal 37 and a fresh solid bismuth metal 38 can be charged into the plating solution 31.

The metallic case 33 is partitioned with a shielding plate 35 into two storage compartments (34a, 34b). The compartment 34a is charged with the solid tin metal 37 and the compartment 34b is charged with the solid bismuth metal 38. The shielding plate 35 is arranged inside the metallic case 33 for the purpose of preventing bismuth, electrolytically dissolved out in the plating solution 31 from the solid bismuth metal 38, from depositing on the solid tin metal 37 through substitution, that is, for the purpose of preventing electrolytically dissolved-out bismuth from moving in a direction vertical to the direction of the electric field in the plating solution 31, or rather for the purpose of preventing electrolytically dissolved-out bismuth from moving toward the solid tin metal 37.

Figure 13:
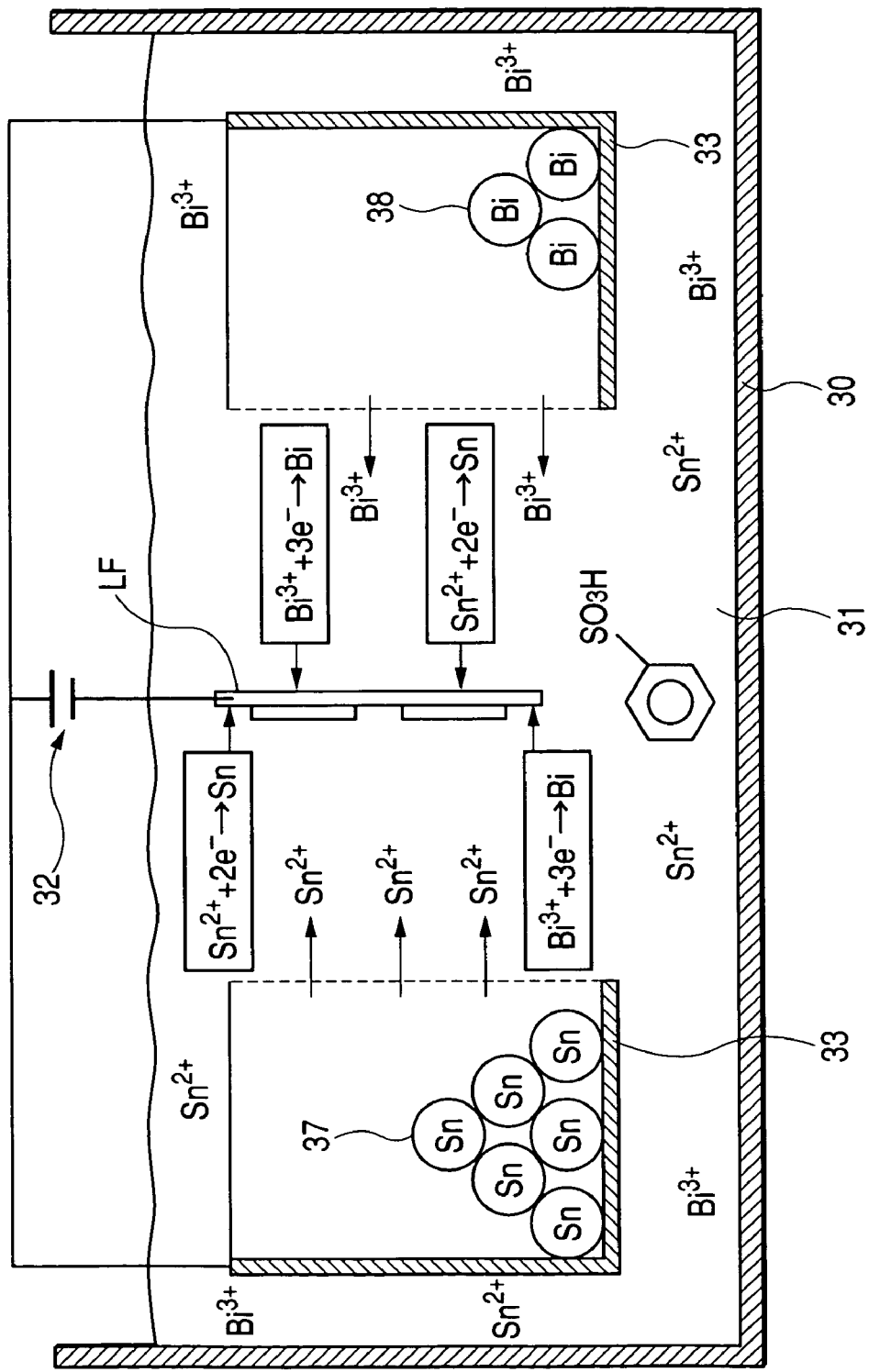
FIG. 13 is a sectional view showing a rough arrangement of a plating unit of the plating apparatus of FIG. 9.

As shown in FIGS. 10 and 13, the metallic cases 33 are, respectively, placed at opposite sides of a transfer path of the lead frame LF so as to sandwich the lead frame LF while keeping them spaced at a given distance. In this way, when the metallic cases 33, each accommodating the solid tin metal 37 and the solid bismuth metal 38, are placed at opposite sides of the transfer path of the lead frame LF, the Sn—Bi alloy layer 9 that is formed through electrolytic deposition on the surface of the lead frame LF, including the terminals for external connection of the leads 4, can be uniformly formed, while suppressing a compositional irregularity therein.

Figure 8:
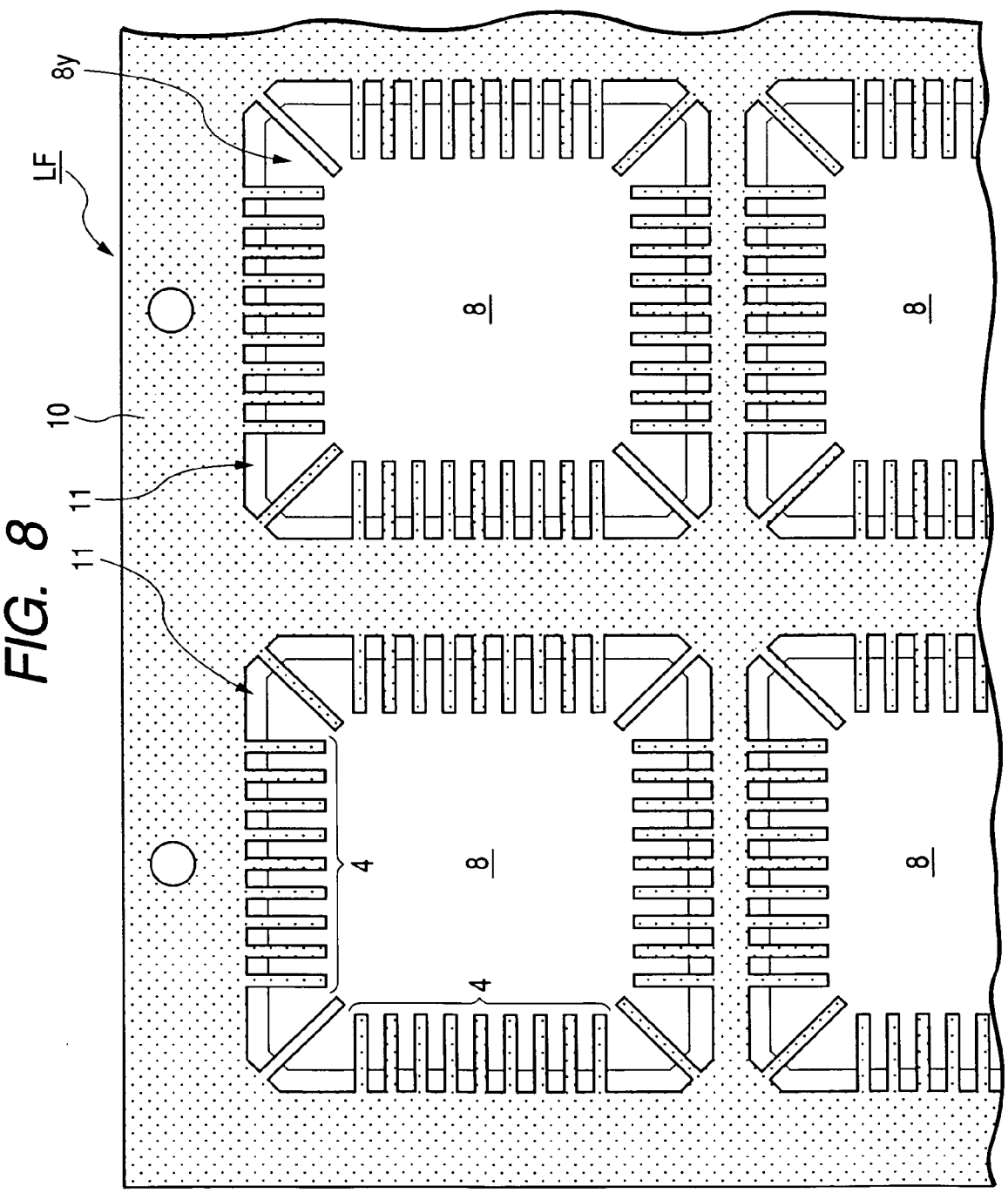
FIG. 8 is a bottom view of a representative part of the lead frame showing the state after the molding step in the manufacture of the semiconductor device.

The plating step is carried out by transferring the lead frame LF, as shown in FIG. 8, which has been subjected to the molding step, to the plating solution 31. The lead frame LF has a multiple structure wherein a plurality of product-forming regions 11 are arranged in line, and thus, it is rectangular as seen in plan view. This lead frame LF is transferred in the plating solution 31 so that the length of the lead frame LF coincides with the transfer direction R. Accordingly, in order to further suppress the compositional irregularity in the Sn—Bi alloy layer 9, it is preferred that different sets of the solid tin metal 37 and the solid bismuth metal 38 are placed along the lead frame transfer path, respectively. In this embodiment, the solid tin metal 37 and the solid bismuth metal 38 that are placed at one side of the lead frame transfer path and the solid tin metal 37 and the solid bismuth metal 38 that are placed at the other side of the lead frame transfer path are arranged in face-to-face relation so as to sandwich the lead frame transfer path therebetween.

The solid tin metal 37 and the solid bismuth metal 38 are each in the form of granular solid metal masses, as particularly shown in FIGS. 12 and 13. When the solid tin metal 37 and the solid bismuth metal 38 are used each in the form of granular solid metal masses, the area of contact between the plating solution 31 and the solid tin metal 37 and the solid bismuth metal 38 increases. Thus, the electrolytic dissolution of tin and bismuth can be stabilized, thereby enabling the compositional irregularity of the Sn—Bi alloy skin layer to be suppressed appropriately.

It will be noted that, although not shown in detail in the figures, the plurality of granular masses of the solid tin metal 37 are round in shape, and a plurality of granular masses of the solid bismuth metal 38 are cylindrical in shape. The spherical and cylindrical granular masses, respectively, have a large surface area, thus contributing to an increase in the area of contact with the plating solution.

Figure 16:
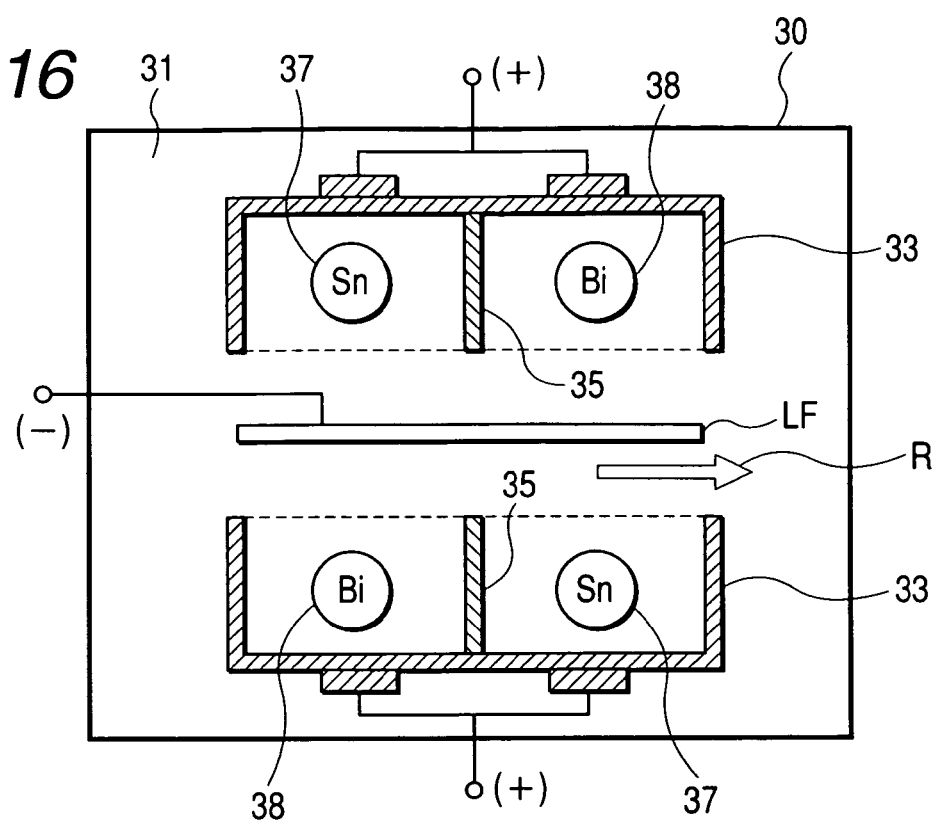
FIG. 16 is a plan view showing a plating unit according to a first modification of the embodiment of the invention.

FIG. 16 is a plan view showing a first modification of the above-stated embodiment of a plating unit.

In the foregoing embodiment, as an example, one set of the solid tin metal 37 and the solid bismuth metal 38 is placed at one side of the lead frame transfer path and another set of the solid tin metal 37 and the solid bismuth metal 38 is placed at the other side of the lead frame transfer path, so that both sets are facing each other, thereby to sandwich the lead frame transfer path therebetween. As shown in FIG. 16, the solid tin metals 37 and the solid bismuth metals of both sets may be alternately arranged along the lead frame transfer direction, so that the solid tin metal 37 on the one side and the solid bismuth metal 38 on the other side are facing each other and the solid bismuth metal 38 on the one side and the solid tin metal 37 on the other side are facing each other. With this arrangement, the compositional irregularity of the Sn—Bi alloy layer 9 can be even further suppressed.

Figure 17:
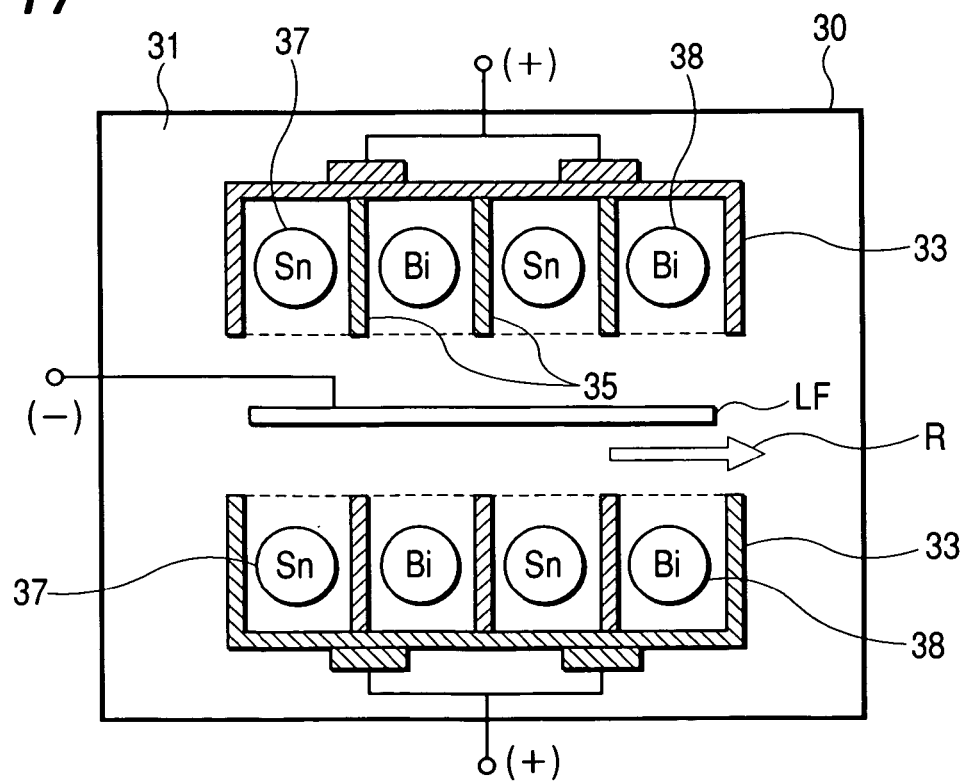
FIG. 17 is a plan view showing a plating unit according to a second modification of the embodiment of the invention.

FIG. 17 is a plan view showing a second modification of the embodiment of the plating unit.

In the foregoing embodiment, for example, the storage compartment 34a for accommodating the solid tin metal 37 and the storage compartment 34b for accommodating the solid bismuth metal 37 are each provided singly. As shown in FIG. 17, plural storage compartments 34a and plural storage compartments 34b may be provided. In this case, the solid tin metal 37 and the solid bismuth metal 38 should preferably be placed in alternate compartments along the transfer direction, as shown in FIG. 17.

Figure 18:
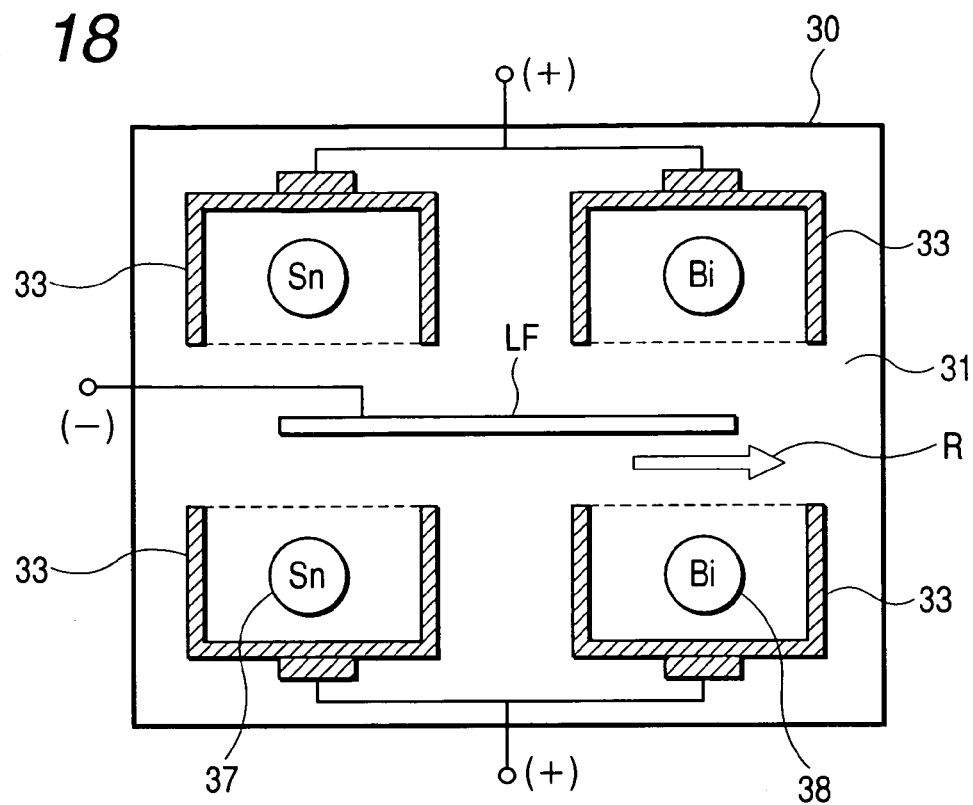
FIG. 18 is a plan view showing a plating unit according to a third modification of the embodiment of the invention.

FIG. 18 illustrates a third modification of the embodiment of the plating unit.

In the foregoing embodiment, for example, the solid tin metal 37 and the solid bismuth metal 38 are separately accommodated in one metallic case provided with a central shielding plate 35, to form separate compartments. As shown in FIG. 18, the solid tin metal 37 and the solid bismuth metal 38 may be accommodated in separate metallic cases, respectively. In this case, the side faces of the metallic cases serve as a shielding plate.

Figure 19:
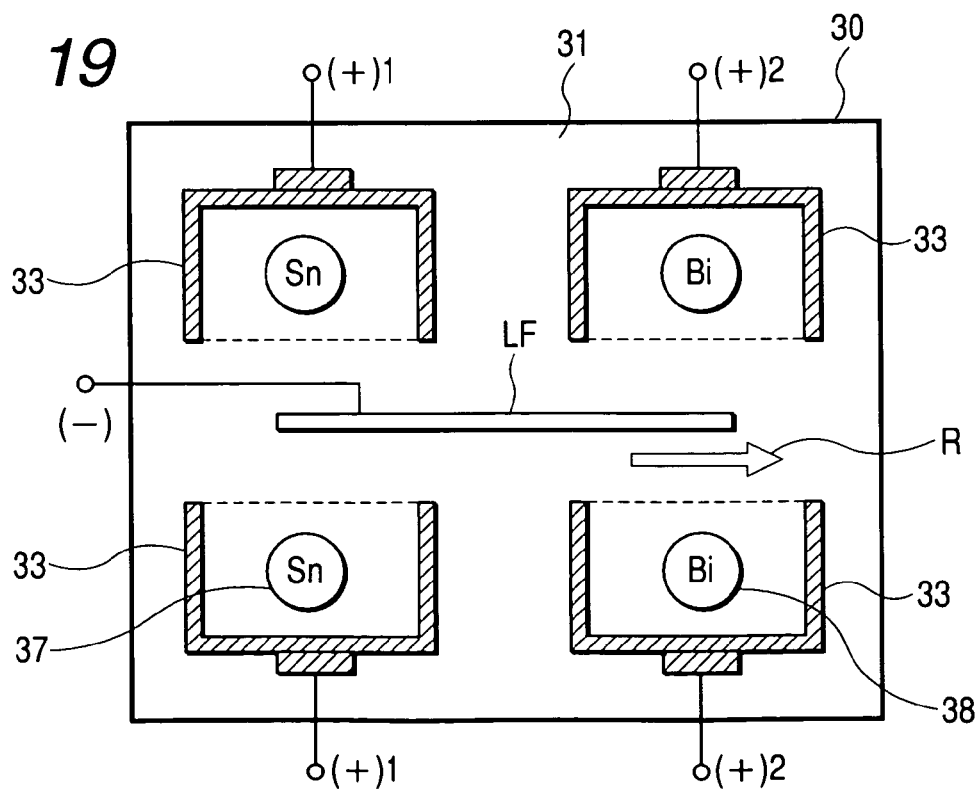
FIG. 19 is a plan view showing a plating unit according to a fourth modification of the embodiment of the invention.

FIG. 19 illustrates a fourth modification of the embodiment of the plating unit. In the foregoing embodiment, one power supply system wherein the solid tin metal 37 and the solid bismuth metal 38 are connected to the same anode has been illustrated. As shown in FIG. 19, a two power system, wherein the solid tin metal 37 is connected to a first anode to which a first potential is fed and the solid bismuth metal 38 is connected to a second anode to which a second potential higher than the first potential is fed, may be used to form the Sn—Bi alloy skin layer 9. Since the solid bismuth metal has a specific resistivity higher than the solid tin metal 37, the use of two power supplies enables the compositional irregularity of the Sn—Bi alloy layer 9 to be further suppressed.

In the aforesaid embodiment, a plating solution containing tin and bismuth and further containing organosulfonic acid solution is used as the plating solution 31. However, in accordance with this invention, a plating solution containing tin and bismuth and further containing an inorganic sulfate solution may be used.

It will be noted that although the invention made by us has been particularly described based on certain embodiments, the invention should not be construed as being limited to those embodiments and many alterations and changes may be possible without departing from the scope of the invention.

For example, although the instance where the invention is applied to the manufacture of a QFN semiconductor device has been illustrated, the invention may be applicable to the manufacture of a semiconductor device wherein a Sn—Bi alloy skin layer is formed at terminals for external connection of leads.

What is claimed is:

1. An electroplating method comprising steps of:
    (a) providing a plating apparatus having a plating vessel, a plating solution located in the plating vessel and containing both tin and bismuth, at least one metallic case having a first storage compartment, a second storage compartment neighboring the first storage compartment, a shielding plate disposed between the first storage compartment and the second storage compartment, a first opening for supplying a solid tin metal to the first storage compartment formed at a top of the first storage compartment of the metallic case, and a second opening for supplying a solid bismuth metal to the second storage compartment formed at a top of the second storage compartment of the metallic case, the metallic case being located in the plating solution further and connecting to an anode of a power supply;
    (b) disposing the solid tin metal in the first storage compartment through the first opening, and disposing the solid bismuth metal in the second storage compartment through the second opening;
    (c) connecting a body to a cathode of the power supply, and disposing the body in the plating solution; and
    (d) after the step (c), forming a tin-bismuth alloy layer over the body by activating the plating apparatus and conducting electrolysis between the anode and the cathode.

2. The electroplating method according to claim 1, wherein the plating solution further contains an organosulfonic acid solution.

3. The electroplating method according to claim 1, wherein the plating solution further contains an inorganic sulfate solution.

4. The electroplating method according to claim 1, wherein the solid tin metal and the solid bismuth metal are made of a plurality of granular solid metal masses respectively.

5. The electroplating method according to claim 4, wherein the plurality of granular solid metal masses of the solid tin metal are round in shape, and wherein the plurality of granular solid metal masses of the solid bismuth metal are cylindrical in shape.

6. The electroplating method according to claim 1, wherein the anode has a first anode connected to a first potential and a second anode connected to a second potential higher than said first potential, and wherein the solid tin metal is connected to the first anode and the solid bismuth metal is connected to the second anode.

7. The electroplating method according to claim 1, wherein the tin in the plating solution is supplied by electrolytically dissolving the solid tin metal into the plating solution, and wherein the bismuth in the plating solution is supplied by electrolytically dissolving the solid bismuth metal into the plating solution.

8. The electroplating method according to claim 1, wherein a surface of the metallic case opposing to the body is constituted of a meshwork.

9. The electroplating method according to claim 1, wherein a plurality of the metallic cases is arranged in the plating vessel in such a manner that the body is placed between the plurality of the metallic cases.

10. The electroplating method according to claim 9, wherein metallic cases, of the plurality of metallic cases, face each other, with solid bismuth metal therein facing solid bismuth metal and solid tin metal therein facing solid tin metal.

11. The electroplating method according to claim 9, wherein metallic cases, of the plurality of metallic cases, face each other, with solid bismuth metal therein facing solid tin metal and solid tin metal therein facing solid bismuth metal.

12. The electroplating method according to claim 1, wherein the shielding plate prevents electrolytically dissolved bismuth from moving from the solid bismuth metal to the solid tin metal.

13. The electroplating method according to claim 1, wherein said plating vessel is a single vessel containing said plating solution.

* * * * *